(12) United States Patent
Sharpless et al.

(10) Patent No.: US 9,613,834 B2
(45) Date of Patent: *Apr. 4, 2017

(54) REPLACEABLE UPPER CHAMBER SECTION OF PLASMA PROCESSING APPARATUS

(75) Inventors: Leonard J. Sharpless, Fremont, CA (US); Harmeet Singh, Fremont, CA (US); Michael S. Kang, San Ramon, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 2014 days.

This patent is subject to a terminal disclaimer.

(21) Appl. No.: 12/748,141

(22) Filed: Mar. 26, 2010

(65) Prior Publication Data

US 2010/0243164 A1 Sep. 30, 2010

Related U.S. Application Data

(60) Provisional application No. 61/164,270, filed on Mar. 27, 2009.

(51) Int. Cl.
*H01L 21/3065* (2006.01)
*H01L 21/67* (2006.01)
*H01J 37/32* (2006.01)

(52) U.S. Cl.
CPC ...... *H01L 21/67069* (2013.01); *H01J 37/321* (2013.01); *H01J 37/32458* (2013.01); *H01J 37/32467* (2013.01); *H01L 21/6719* (2013.01); *H01L 21/67126* (2013.01)

(58) Field of Classification Search
None
See application file for complete search history.

(56) References Cited

U.S. PATENT DOCUMENTS

| 5,095,189 A | * | 3/1992 | Frind et al. ............... 219/121.47 |
| 5,480,678 A | * | 1/1996 | Rudolph et al. ............ 427/248.1 |
| 5,597,439 A | | 1/1997 | Salzman |
| 5,863,376 A | | 1/1999 | Wicker et al. |

(Continued)

OTHER PUBLICATIONS

Corresponding U.S. Appl. No. 61/164,270, filed Mar. 27, 2009.

(Continued)

*Primary Examiner* — Gordon R Baldwin
*Assistant Examiner* — Aiden Lee

(57) ABSTRACT

A replaceable upper chamber section of a plasma reaction chamber in which semiconductor substrates can be processed comprises a monolithic metal cylinder having a conical inner surface which is widest at a lower end thereof, an upper flange extending horizontally outward away from the conical inner surface and a lower flange extending horizontally away from the conical inner surface. The cylinder includes an upper annular vacuum sealing surface adapted to seal against a dielectric window of the plasma chamber and a lower annular vacuum sealing surface adapted to seal against a bottom section of the plasma chamber. A thermal mass at an upper portion of the cylinder is effective to provide azimuthal temperature uniformity of the conical inner surface. A thermal choke is located at a lower portion of the cylinder and is effective to minimize transfer of heat across the lower vacuum sealing surface.

18 Claims, 5 Drawing Sheets

(56) References Cited

U.S. PATENT DOCUMENTS

| | | | |
|---|---|---|---|
| 5,983,906 A * | 11/1999 | Zhao et al. | 134/1.1 |
| 6,074,953 A | 6/2000 | Donohoe et al. | |
| 6,095,083 A * | 8/2000 | Rice et al. | 118/723 I |
| 6,113,732 A * | 9/2000 | Yoshida et al. | 156/345.37 |
| 6,132,553 A * | 10/2000 | Ikeda et al. | 156/345.1 |
| 6,174,377 B1 | 1/2001 | Doering et al. | |
| 6,178,918 B1 | 1/2001 | van Os et al. | |
| 6,298,784 B1 * | 10/2001 | Knowlton et al. | 102/275.3 |
| 6,308,654 B1 | 10/2001 | Schneider et al. | |
| 6,676,758 B2 | 1/2004 | Sillmon et al. | |
| 6,972,071 B1 * | 12/2005 | Tyler | 156/345.47 |
| 7,001,491 B2 | 2/2006 | Lombardi et al. | |
| 7,220,497 B2 * | 5/2007 | Chang | 428/701 |
| 7,223,321 B1 | 5/2007 | Comendant et al. | |
| 7,712,434 B2 * | 5/2010 | Dhindsa et al. | 118/723 E |
| 7,780,791 B2 * | 8/2010 | Sharpless et al. | 118/724 |
| 7,785,417 B2 | 8/2010 | Ni et al. | |
| 8,444,926 B2 | 5/2013 | Fodor et al. | |
| 2003/0131794 A1 * | 7/2003 | Rosenstein et al. | 118/722 |
| 2004/0149212 A1 * | 8/2004 | Cho et al. | 118/715 |
| 2006/0000413 A1 | 1/2006 | Sharpless et al. | |
| 2007/0209781 A1 * | 9/2007 | Hamman | 165/69 |
| 2009/0183677 A1 | 7/2009 | Tian et al. | |
| 2011/0056626 A1 | 3/2011 | Brown et al. | |

OTHER PUBLICATIONS

Commonly Assigned U.S. Appl. No. 61/241,321, filed Sep. 10, 2009.

Search and Examination Report issued on Dec. 14, 2011 in Singapore Appln. No. 201100619-4.

* cited by examiner

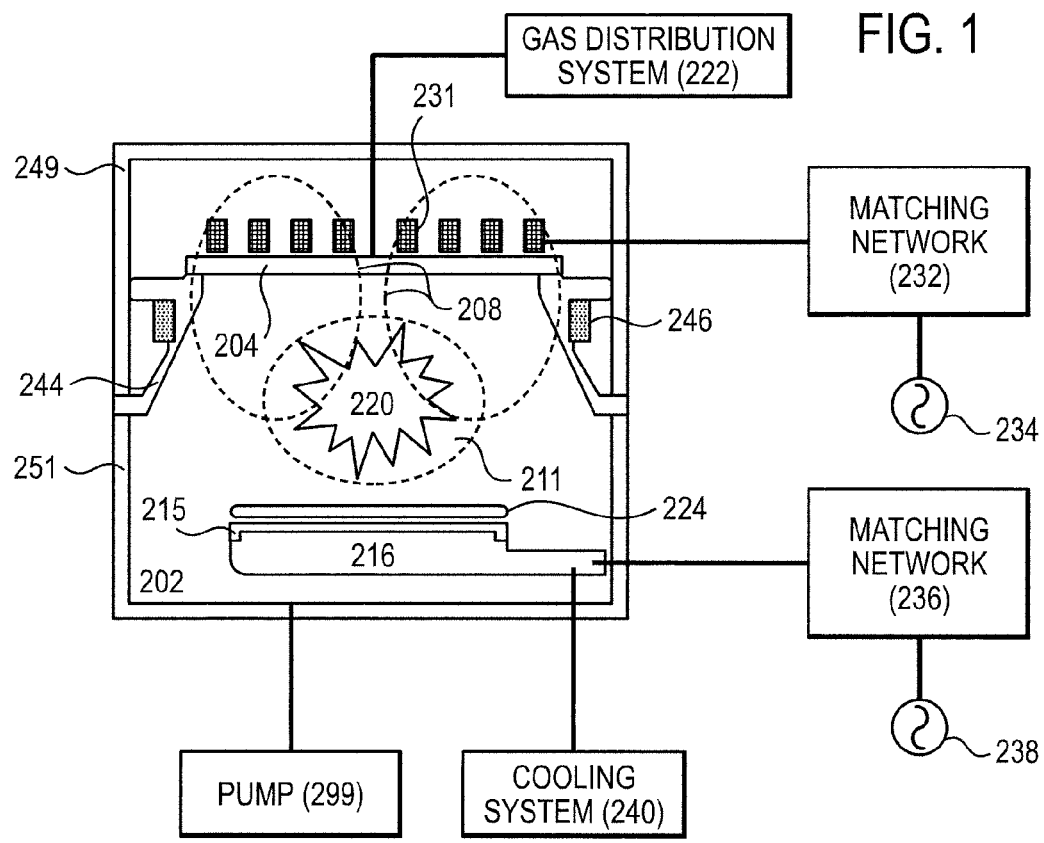
FIG. 1
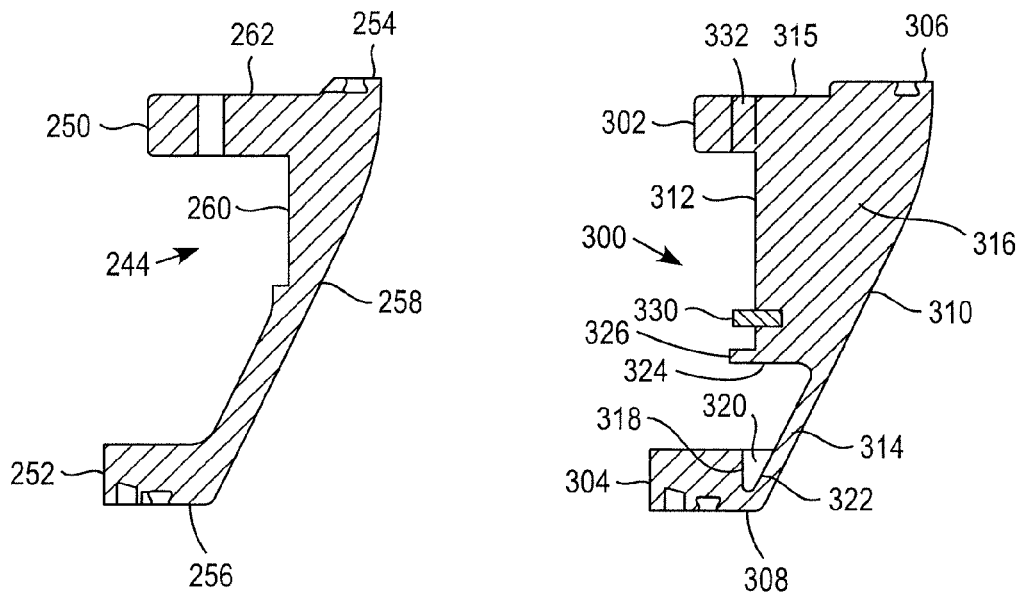
FIG. 2 PRIOR ART
FIG. 3

REPLACEABLE UPPER CHAMBER SECTION OF PLASMA PROCESSING APPARATUS

CROSS REFERENCE TO RELATED APPLICATION

This application claims priority under 35 U.S.C. §119 to U.S. Provisional Application No. 61/164,270 entitled REPLACEABLE UPPER CHAMBER SECTION OF PLASMA PROCESSING APPARATUS, filed Mar. 27, 2009, the entire content of which is hereby incorporated by reference.

FIELD OF THE INVENTION

The present invention relates in general to semiconductor substrate manufacturing technologies and in particular to a replacement upper chamber section of a plasma chamber.

BACKGROUND OF THE INVENTION

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant source are then flowed into the chamber and struck to form a plasma to etch exposed areas of the substrate.

Referring now to FIG. 1, a simplified diagram of inductively coupled plasma processing system components is shown. Generally, the plasma chamber (chamber) 202 is comprised of a bottom chamber section 251 forming a sidewall of the chamber, an upper chamber section 244 also forming a sidewall of the chamber, and a cover 249. An appropriate set of gases is flowed into chamber 202 from gas distribution system 222. These plasma processing gases may be subsequently ionized to form a plasma 220, in order to process (e.g., etch or deposition) exposed areas of substrate 224, such as a semiconductor substrate or a glass pane, positioned with edge ring 215 on an electrostatic chuck (chuck) 216. Gas distribution system 222 is commonly comprised of compressed gas cylinders (not shown) containing plasma processing gases (e.g., $C_4F_8$, $C_4F_6$, $CHF_3$, $CH_2F_3$, $CF_4$, HBr, $CH_3F$, $C_2F_4$, $N_2$, $O_2$, Ar, Xe, He, $H_2$, $NH_3$, $SF_6$, $BCl_3$, $Cl_2$, etc.).

Induction coil 231 is separated from the plasma by a dielectric window 204 forming the upper wall of the chamber, and generally induces a time-varying electric current in the plasma processing gases to create plasma 220. The window both protects induction coil from plasma 220, and allows the generated RF field 208 to generate an inductive current 211 within the plasma processing chamber. Further coupled to induction coil 231 is matching network 232 that may be further coupled to RF generator 234. Matching network 232 attempts to match the impedance of RF generator 234, which typically operates at about 13.56 MHz and about 50 ohms, to that of the plasma 220. Additionally, a second RF energy source 238 may also be coupled through matching network 236 to the substrate 224 in order to create a bias with the plasma, and direct the plasma away from structures within the plasma processing system and toward the substrate. Gases and byproducts are removed from the chamber by a pump 299.

Generally, some type of cooling system 240 is coupled to chuck 216 in order to achieve thermal equilibrium once the plasma is ignited. The cooling system itself is usually comprised of a chiller that pumps a coolant through cavities in within the chuck, and helium gas pumped between the chuck and the substrate. In addition to removing the generated heat, the helium gas also allows the cooling system to rapidly control heat dissipation. That is, increasing helium pressure subsequently also increases the heat transfer rate. Most plasma processing systems are also controlled by sophisticated computers comprising operating software programs. In a typical operating environment, manufacturing process parameters (e.g., voltage, gas flow mix, gas flow rate, pressure, etc.) are generally configured for a particular plasma processing system and a specific recipe.

In addition, a heating and cooling apparatus 246 may operate to control the temperature of the upper chamber section 244 of the plasma chamber 202 such that the inner surface of the upper chamber section 244, which is exposed to the plasma during operation, is maintained at a controlled temperature. The heating and cooling apparatus 246 is formed by several different layers of material to provide both heating and cooling operations.

The upper chamber section itself is commonly constructed from plasma resistant materials that either will ground or are transparent to the generated RF field within the plasma processing system (e.g., coated or uncoated aluminum, ceramic, etc.).

For example, the upper chamber section can be a machined piece of aluminum which can be removed for cleaning or replacement thereof. The inner surface of the upper chamber section is preferably coated with a plasma resistant material such as a thermally sprayed yttria coating. Cleaning is problematic in that the ceramic coatings of this type are easily damaged and due to the sensitive processing of some plasma processes, it is sometimes preferred to replace the upper chamber section rather than remove it for cleaning.

In addition, correctly reseating the upper chamber section after maintenance is often difficult, since it must properly be aligned with the bottom chamber section such that a set of gaskets properly seal around the upper chamber section. A slight misalignment will preclude a proper mounting arrangement.

The volume of material in the upper chamber section also tends to add a substantial thermal mass to the plasma processing system. Thermal mass refers to materials have the capacity to store thermal energy for extended periods. In general, plasma processes tend to very sensitive to temperature variation. For example, a temperature variation outside the established process window can directly affect the etch rate or the deposition rate of polymeric films, such as poly-fluorocarbon, on the substrate surface. Temperature repeatability between substrates is often desired, since many plasma processing recipes may also require temperature variation to be on the order of a few tenths of degree C. Because of this, the upper chamber section is often heated or cooled in order to substantially maintain the plasma process within established parameters.

As the plasma is ignited, the substrate absorbs thermal energy, which is subsequently measured and then removed through the cooling system. Likewise., the upper chamber section can be thermally controlled. However, plasma processing may require temperature changes during multi-step processing and it may be necessary to heat the upper chamber section to temperatures above 100° C., e.g. 120, 130, 140, 150 or 160° C. or any temperature therebetween whereas the prior upper chamber sections were run at much lower temperatures on the order of 60° C. The higher temperatures can cause undesirable increases in temperature of adjacent components such as the bottom chamber section. For example, if it is desired to run the upper chamber section and overlying dielectric window at temperatures on the order of 130 to 150° C. and the bottom chamber section at ambient temperatures of about 30° C., heat from the much hotter upper chamber section can flow into the bottom chamber section and raise its temperature sufficiently to affect the plasma processing conditions seen by the semiconductor substrate. Thus, heat flow variations originating from the upper chamber section may cause the substrate temperature to vary outside narrow recipe parameters.

In view of the foregoing, a replaceable upper chamber section having improved thermal characteristics would be of interest for optimizing plasma processing in a plasma processing system.

SUMMARY OF THE INVENTION

In a preferred embodiment, a replaceable upper chamber section of a plasma reaction chamber in which semiconductor substrates can be processed, comprises a monolithic metal cylinder having a conical inner surface which is widest at a lower end thereof, an upper flange extending horizontally outward away from the conical inner surface and a lower flange extending horizontally away from the conical inner surface; an upper annular vacuum sealing surface adapted to seal against a dielectric window of the plasma chamber; a lower annular vacuum sealing surface adapted to seal against a bottom section of the plasma chamber; a thermal mass at an upper portion of the cylinder, the thermal mass defined by a portion of the cylinder between the conical inner surface and an outer surface extending vertically from the upper flange, the thermal mass being effective to provide azimuthal temperature uniformity of the conical inner surface, and a thermal choke at a lower portion of the cylinder effective to minimize transfer of heat across the lower vacuum sealing surface, the thermal choke defined by a thin metal section having a thickness of less than 0.25 inch and extending at least 25% of the length of the conical inner surface.

BRIEF DESCRIPTION OF THE DRAWING FIGURES

FIG. 1 shows a simplified diagram of a plasma processing system.

FIG. 2 shows a cross section of a prior upper chamber section.

FIG. 3 shows a cross section of an upper chamber section according to one embodiment.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. As used herein, the term "about" should be construed to include values up to 10% above or below the values recited.

Figure 4:
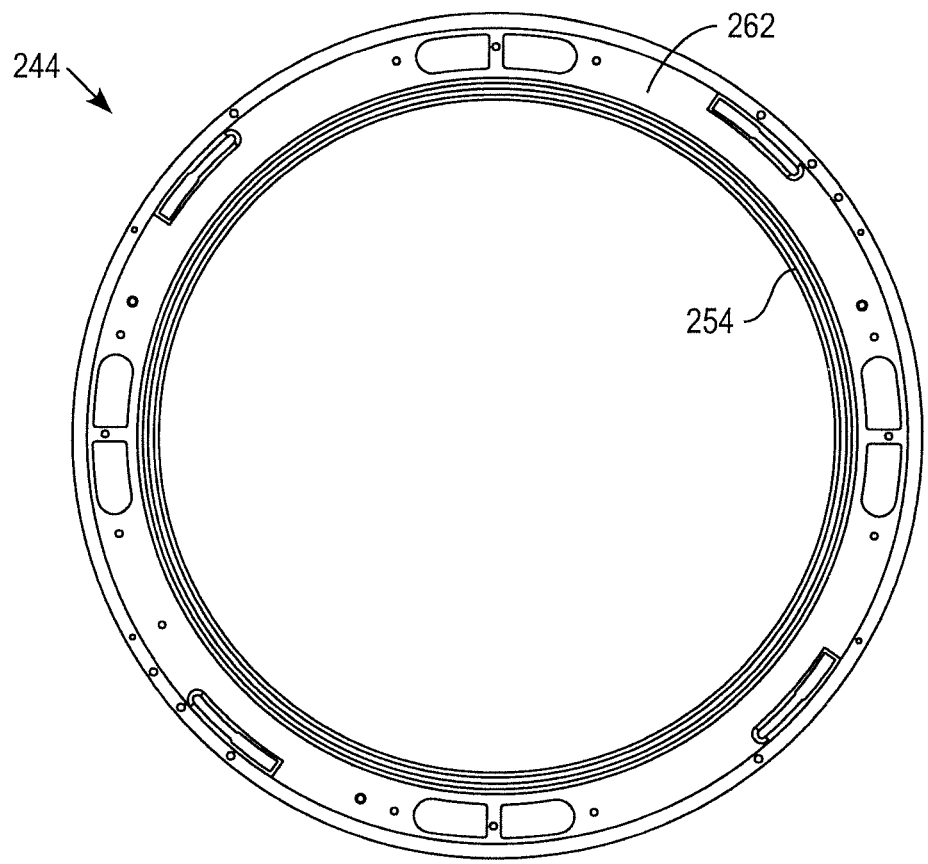
FIG. 4 shows a top view of the upper chamber section shown in FIG. 2.
Figure 5:
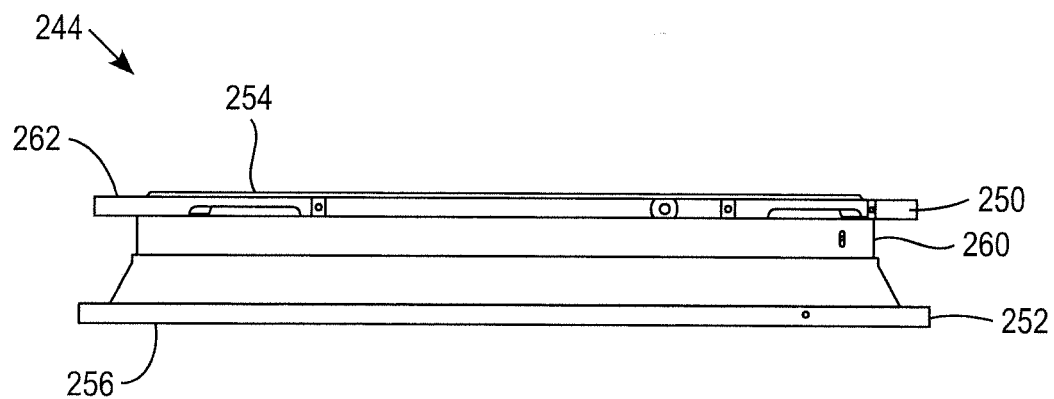
FIG. 5 shows a side view of the upper chamber section shown in FIG. 2.
Figure 6:
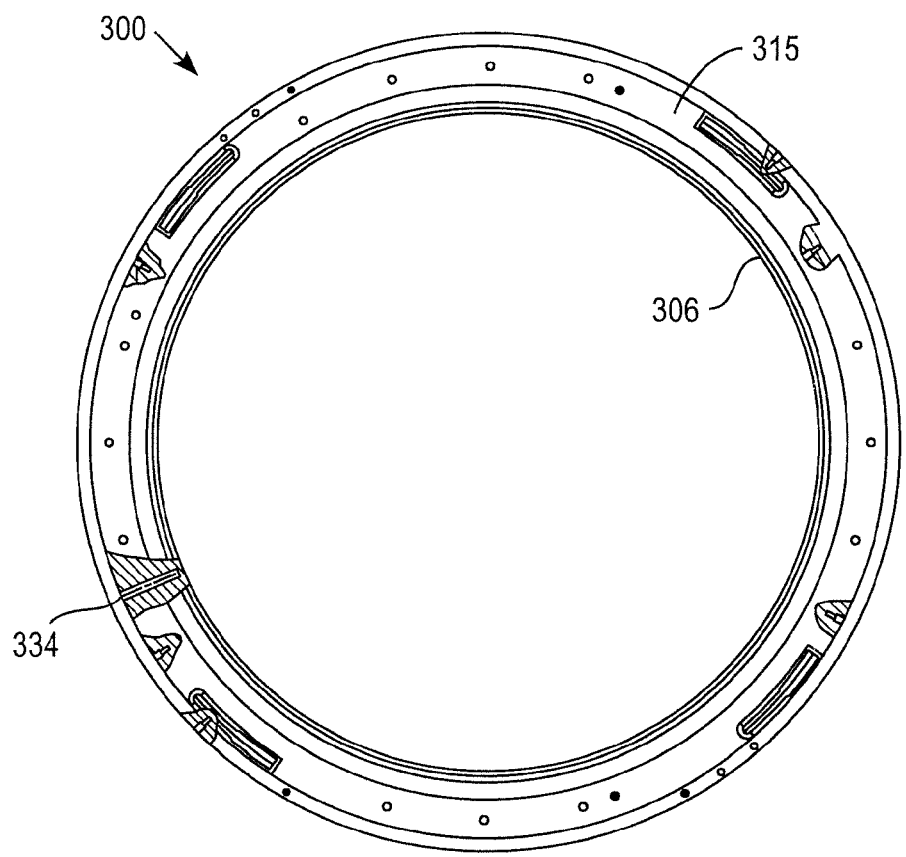
FIG. 6 shows a top view of the upper chamber section shown in FIG. 3.
Figure 7:
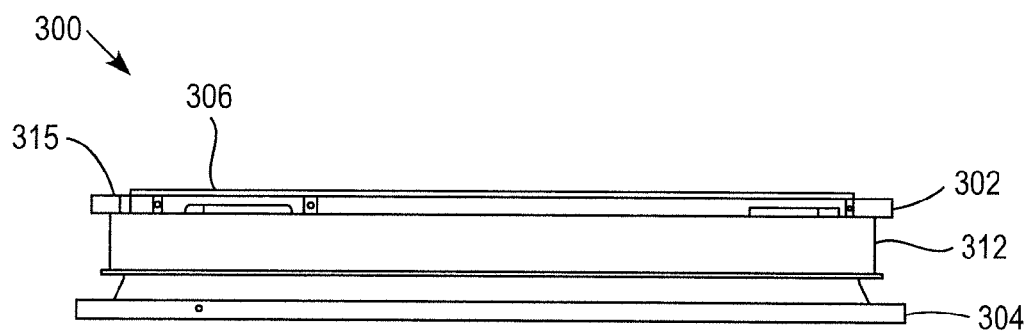
FIG. 7 shows a side view of the upper chamber section shown in FIG. 3.

Compared to the previously designed upper chamber section shown in FIGS. 2, 4 and 5, the redesigned upper chamber section shown in FIGS. 3, 6 and 7 has improved azimuthal temperature uniformity, improved thermal transfer to the overlying dielectric window and reduced thermal transfer to the underlying bottom chamber section. The prior upper chamber section shown in FIGS. 2, 4 and 5 was designed for low mass and ease of service due to its reduced weight. The design of the upper chamber section was changed to achieve improved azimuthal thermal uniformity by increasing the contact area of the upper surface in contact with the overlying window, increasing mass to improve azimuthal uniformity, and decreasing wall thickness to minimize thermal transfer to the bottom chamber section.

In a preferred embodiment, the upper chamber section is a hard anodized aluminum cylinder that has features for mounting process support hardware (RF input coil, temperature controlled window, alignment features, chamber temperature control hardware, etc.), sealing vacuum, and conducting electrical current out of the part. The vacuum seals are preferably one or more O-rings at the top and bottom of the cylinder. Electrical conduction is preferably established through the use of a metallic spring RF gasket that fits into a groove on the cylinder and contacts a bare metal strip on an adjacent component. The weight and thermal mass are increased at the upper portion of the cylinder to achieve the desired temperature uniformity. The internal shape of the plasma exposed surface is the same as the prior upper chamber section to duplicate the electrical, gas flow and plasma containment features of the prior upper chamber section. The change in design can be seen by comparing the cross sections shown in FIGS. 2 and 3.

The upper chamber section shown in FIG. 3 differs from the prior upper chamber section shown in FIG. 2 with respect to features for mounting temperature control, mounting and alignment hardware. Such changes in design can be seen by comparing the views shown in FIGS. 4-5 to the views shown in FIGS. 6-7. For example, the new design of the upper chamber section is at least 40% heavier than the prior upper chamber section and the new design has removable auxiliary hardware (alignment features, bumper features, etc) which minimize the potential contaminating materials from being run through a clean cycle with the upper chamber section. In contrast, the prior upper chamber section was designed to be cleaned with plastic and stainless steel components still attached.

With reference to FIGS. 2 and 4-5, the prior upper chamber section 244 includes an upper flange 250, a lower flange 252, an upper vacuum sealing surface 254 which includes an annular groove for receipt of an O-ring, a lower vacuum sealing surface 256 which includes an annular groove for receipt of an O-ring and another annular groove for receipt of an RF gasket, an inner conical surface 258, an outer surface 260 for mounting the heating and cooling hardware 246, and an upper recessed surface 262. As can be seen in FIG. 2, the upper vacuum sealing surface 254 is smaller than the lower vacuum sealing surface 256 and the heat flow from the upper chamber section 244 favors heat transfer to the bottom chamber section 251 rather than to the window 204. Also, the upper chamber section 244 is designed to be lightweight making control of thermal uniformity more reliant on the heating and cooling hardware and less dependent on the thermal mass of the upper chamber section itself.

With reference to FIGS. 3 and 6-7, the redesigned upper chamber section 300 includes an upper flange 302, a lower flange 304, an upper vacuum sealing surface 306 which includes an annular groove for receipt of an O-ring, a lower vacuum sealing surface 308 which includes an annular groove for receipt of an O-ring and another annular groove for receipt of an RF gasket, an inner conical surface 310, an outer surface 312 for mounting the heating and cooling hardware 246, and an upper recessed surface 315. As can be seen in FIG. 3, the upper vacuum sealing surface 306 is larger than the upper vacuum sealing surface of the prior upper chamber section 244 and thus provides improved thermal transfer with the window 204. To minimize thermal transfer to the bottom chamber section 251, the upper chamber section 300 includes a thermal choke 314 formed by a thin walled section of the cylinder. Preferably, the thickness of thermal choke 314 is less than 0.25 inch and more preferably is about 0.125 inch in thickness. The length of the thermal choke is preferably at least 0.5 inch and more preferably at least 1 inch in length. The thermal choke preferably begins close to the vacuum sealing surface 308 and ends at a thermal mass section 316 of the cylinder. The flange 304 includes a vertical surface 318 forming a V-shaped groove 320 with an outer surface 322 of the thermal choke 314. The thermal mass section 316 begins at a horizontal surface 324 which is spaced from the upper recessed surface 315 by at least 2 inches, preferably about 2.15 inches.

In the embodiment shown in FIG. 3, the outer surface 312 is recessed between the flange 302 and an annular rim 326 for receipt of the heating and cooling arrangement 246. An alignment pin 330 located in a hole in the outer surface 312 can be used to position the heating and cooling arrangement 246. A series of circumferentially spaced apart vertical mounting holes 332 in the upper flange 302 can be used to mount an RF coil assembly which includes RF coil 231. Other holes and/or slots can be provided in the upper flange 302 to cooperate with other equipment such as a bumper to protect the window 204 from being damaged during mounting on the upper vacuum sealing surface 306 or a mechanism which locks into the upper chamber section for installation and removal thereof. One or more temperature probe mounting holes 334 can be provided in the outer surface 312 for single zone or multiple zone temperature control.

In a preferred embodiment, the upper chamber section 300 is a monolithic aluminum cylinder having an inner diameter of 18 inches at the inner edge of the vacuum sealing surface 306, an outer diameter of 21.75 inches at the outer edge of the upper flange 302, an inner diameter of 21.15 inches at the inner edge of the lower vacuum sealing surface 308 and an outer diameter of 22.48 inches at the outer edge of the lower flange 304. The O-ring groove in the upper vacuum sealing surface is located on a diameter of 18.220 to 18.275 inches and the O-ring groove in the lower vacuum sealing surface is located on a diameter of about 21.45 inches and the groove for the RF gasket is located on a diameter of about 21.94 inches. The inner edge of the upper recessed surface has a diameter of 19.625 inches.

Figure 8:
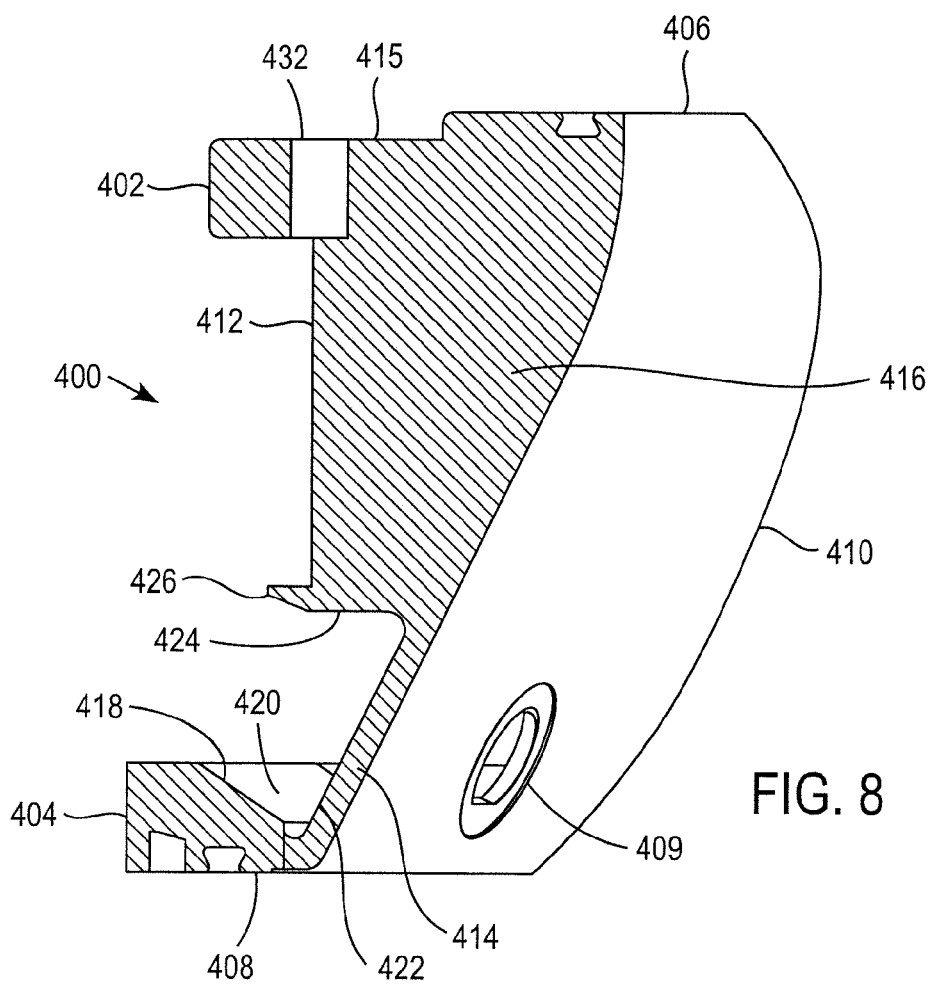
FIG. 8 shows a perspective cross-sectional view of an upper chamber section.
Figure 9:
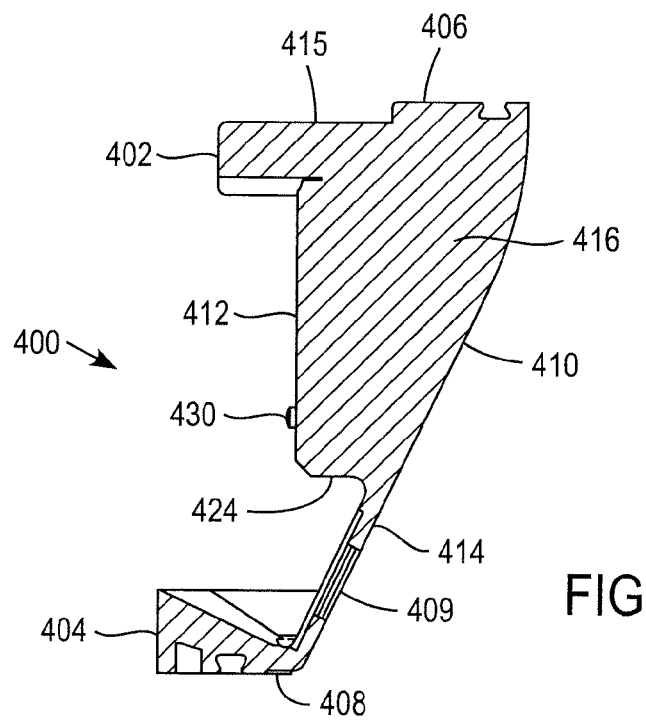
FIG. 9 is a cross section of the upper chamber section shown in FIG. 8.
Figure 10:
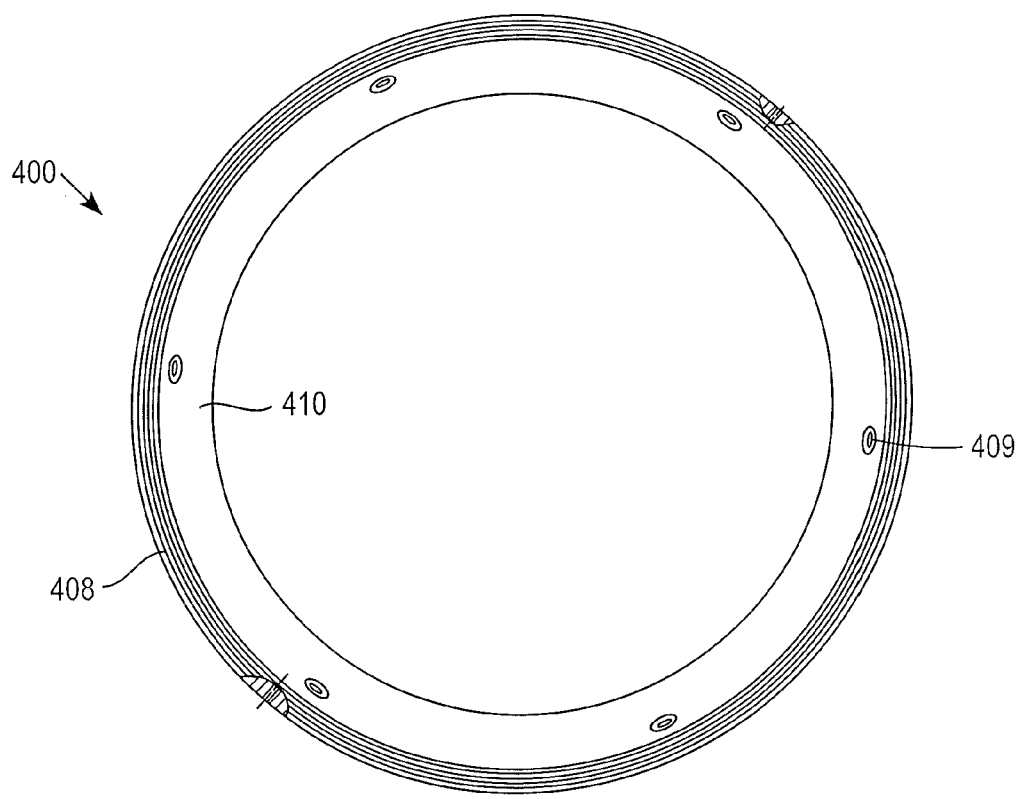
FIG. 10 is a bottom view of the upper chamber section shown in FIG. 8.
Figure 11:
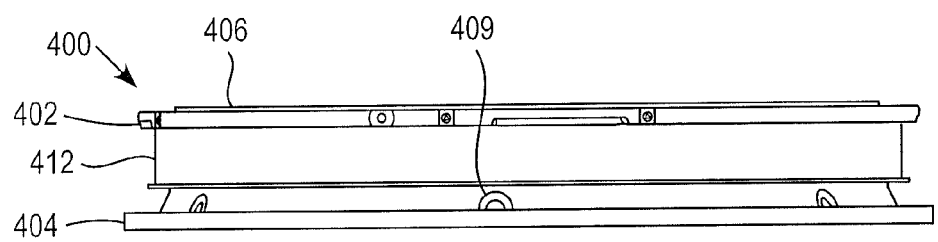
FIG. 11 is a side view of the upper chamber section shown in FIG. 8.
Figure 12:
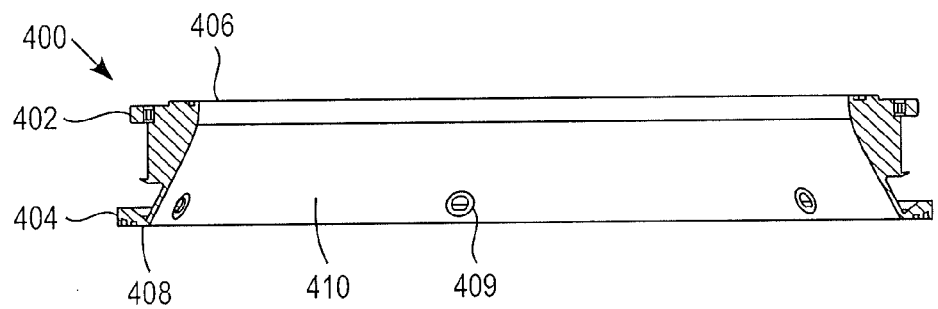
FIG. 12 is a cross-sectional side view of the upper chamber section shown in FIG. 11.

Another embodiment of the upper chamber section is shown in FIGS. 8-12. In this embodiment, the upper chamber section 400 includes an upper flange 402, a lower flange 404, an upper vacuum sealing surface 406 which includes an annular groove for receipt of an O-ring, a lower vacuum sealing surface 408 which includes an annular groove for receipt of an O-ring and another annular groove for receipt of an RF gasket, an inner conical surface 410 having a series of circumferentially spaced apart holes 409 for mounting gas injectors (not shown), an outer surface 412 for mounting the heating and cooling hardware 246, and an upper recessed surface 415. As can be seen in FIG. 8, the upper vacuum sealing surface 406 is larger than the upper vacuum sealing surface of the prior upper chamber section 244 and thus provides improved thermal transfer with the window 204. To minimize thermal transfer to the bottom chamber section 251, the upper chamber section 400 includes a thermal choke 414 formed by a thin walled section of the cylinder. Preferably, the thickness of thermal choke 414 is less than 0.25 inch and more preferably is about 0.10 to 0.125 inch in thickness. The length of the thermal choke can preferably at least 0.5 inch and more preferably at least 1 inch in length. The thermal choke preferably begins close to the vacuum sealing surface 408 and ends at a thermal mass section 416 of the cylinder. The flange 404 includes an angled surface 418 forming a V-shaped groove 420 with an outer surface 422 of the thermal choke 414. The thermal mass section 416 begins at a horizontal surface 424 which is spaced from the upper recessed surface 415 by at least 2 inches, preferably about 2.3 inches.

In the embodiment shown in FIGS. 8-12, the outer surface 412 is recessed between the flange 402 and an annular rim 426 for receipt of the heating and cooling arrangement 246. An alignment pin 430 located in a hole in the outer surface 412 can be used to position the heating and cooling arrangement 246. A series of circumferentially spaced apart vertical mounting holes 432 in the upper flange 402 can be used to mount an RF coil assembly which includes RF coil 231. Other holes and/or slots can be provided in the upper flange 402 to cooperate with other equipment such as a bumper to protect the window 204 from being damaged during mounting on the upper vacuum sealing surface 406 or a mechanism which locks into the upper chamber section for installation and removal thereof. One or more temperature probe mounting holes can be provided in the outer surface 412 for single zone or multiple zone temperature control.

In a preferred embodiment, the upper chamber section 400 is a monolithic aluminum cylinder having an inner diameter of 18 inches at the inner edge of the vacuum sealing surface 406, an outer diameter of 21.75 inches at the outer edge of the upper flange 402, an inner diameter of 21.15 inches at the inner edge of the lower vacuum sealing surface 408 and an outer diameter of 22.48 inches at the outer edge of the lower flange 404. The O-ring groove in the upper vacuum sealing surface is located on a diameter of 18.220 to 18.275 inches and the O-ring groove in the lower vacuum sealing surface is located on a diameter of about 21.45 inches and the groove for the RF gasket is located on a diameter of about 21.94 inches. The inner edge of the upper recessed surface has a diameter of 19.625 inches.

While this invention has been described in terms of several preferred embodiments, there are alterations, permutations, and equivalents which fall within the scope of this invention. For example, although the present invention has been described in connection with plasma processing systems from Lam Research Corporation (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, etc.). Also, materials other than aluminum may be used, such as ceramics.

Having disclosed exemplary embodiments and the best mode, modifications and variations may be made to the disclosed embodiments while remaining within the subject and spirit of the invention as defined by the following claims.

What is claimed is:

1. A replaceable upper chamber section of a plasma reaction chamber in which semiconductor substrates can be processed, comprising:
   a monolithic metal cylinder having a conical inner surface which has a largest diameter at a lower end thereof, an upper flange extending horizontally outward away from the conical inner surface and a lower flange extending horizontally away from the conical inner surface;
   an upper annular vacuum sealing surface adapted to seal against a dielectric window of the plasma chamber;
   a lower annular vacuum sealing surface adapted to seal against a bottom section of the plasma chamber;
   a thermal choke at a lower portion of the cylinder effective to minimize transfer of heat across the lower vacuum sealing surface, the thermal choke defined by a thin metal section having a thickness of less than 0.25 inch and extending at least 25% of the length of the conical inner surface; and
   a thermal mass section at an upper portion of the cylinder, the thermal mass section defined by a portion of the cylinder between the conical inner surface, an outer surface extending vertically from the upper flange, a horizontal surface extending from an upper end of the thermal choke, and the upper flange.

2. The replaceable upper chamber section of claim 1, wherein the upper and lower vacuum sealing surfaces include at least one annular groove therein adapted to receive an O-ring.

3. The replaceable upper chamber section of claim 1, wherein the upper flange includes a recessed surface extending horizontally at least 1 inch from the outer surface and the upper vacuum sealing surface extends horizontally at least 1 inch, the outer surface is spaced from the conical inner surface by at least 1 inch at a lower end of the outer surface and the outer surface is spaced from the conical inner surface by at least 2 inches at an upper end of the outer surface.

4. The replaceable upper chamber section of claim 1, wherein the outer surface is recessed and includes an alignment pin hole adapted to receive an alignment pin used to position a heating and cooling arrangement on the outer surface.

5. The replaceable upper chamber section of claim 1, including at least one temperature probe mounting hole extending into the upper flange.

6. The replaceable upper chamber section of claim 1, wherein the conical inner surface includes a plurality of mounting holes adapted to mount gas injectors therein.

7. The replaceable upper chamber section of claim 1, wherein the upper flange includes mounting holes adapted to receive an RF coil mounting assembly which positions an RF coil above the dielectric window.

8. The replaceable upper chamber section of claim 1, wherein the conical inner surface includes a thermally sprayed yttria coating thereon.

9. The replaceable upper chamber section of claim 1, wherein the cylinder is anodized aluminum.

10. The replaceable upper chamber section of claim 1, comprising:
    a heating and cooling arrangement, which mounts around the outer surface.

11. The replaceable upper chamber section of claim 1, wherein the upper annular vacuum sealing surface has a greater surface area than the lower annular vacuum sealing surface.

12. The replaceable upper chamber section of claim 1, wherein the horizontal surface is spaced from the upper recessed surface by at least two inches.

13. The replaceable upper chamber section of claim 1, wherein the thermal choke extends from the vacuum sealing surface to the thermal mass section of the cylinder.

14. A replaceable upper chamber section of a plasma reaction chamber in which semiconductor substrates can be processed, comprising:
    a monolithic metal cylinder having a conical inner surface which has a largest diameter at a lower end thereof, an upper flange extending horizontally outward away from the conical inner surface and a lower flange extending horizontally away from the conical inner surface;
    an upper annular vacuum sealing surface adapted to seal against a dielectric window of the plasma chamber, and a lower annular vacuum sealing surface adapted to seal against a bottom section of the plasma chamber, the upper annular vacuum sealing surface having a greater surface area than the lower annular vacuum sealing surface;
    a thermal choke at a lower portion of the cylinder effective to minimize transfer of heat across the lower vacuum sealing surface, the thermal choke defined by a thin metal section having a thickness of less than 0.25 inch and extending at least 25% of the length of the conical inner surface; and
    a thermal mass section at an upper portion of the cylinder, the thermal mass section defined by a portion of the cylinder between the conical inner surface, an outer surface extending vertically from the upper flange, a horizontal surface extending from an upper end of the thermal choke, and the upper flange, and wherein the thermal choke extends from the vacuum sealing surface to the thermal mass section of the cylinder.

15. The replaceable upper chamber section of claim 14, wherein the upper and lower vacuum sealing surfaces include at least one annular groove therein adapted to receive an O-ring.

16. The replaceable upper chamber section of claim 14, comprising:
   a heating and cooling arrangement, which mounts around the outer surface.

17. The replaceable upper chamber section of claim 14, wherein the conical inner surface includes a thermally sprayed yttria coating thereon.

18. The replaceable upper chamber section of claim 14, wherein the cylinder is anodized aluminum.

* * * * *